(12) United States Patent
Lee et al.

(10) Patent No.: US 8,466,472 B2
(45) Date of Patent: Jun. 18, 2013

(54) SEMICONDUCTOR DEVICE, METHOD OF MANUFACTURING THE SAME, AND ELECTRONIC DEVICE INCLUDING THE SEMICONDUCTOR DEVICE

(75) Inventors: Moon Sang Lee, Seoul (KR); Sung Soo Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 20 days.

(21) Appl. No.: 13/098,165

(22) Filed: Apr. 29, 2011

(65) Prior Publication Data

US 2012/0153296 A1    Jun. 21, 2012

(30) Foreign Application Priority Data

Dec. 17, 2010   (KR) .................. 10-2010-0130177

(51) Int. Cl.
*H01L 33/02* (2010.01)
(52) U.S. Cl.
USPC ......... 257/76; 257/E33.006; 977/762; 438/47
(58) Field of Classification Search
None
See application file for complete search history.

(56) References Cited

U.S. PATENT DOCUMENTS

| | | | |
|---|---|---|---|
| 2004/0157358 A1* | 8/2004 | Hiramatsu et al. | 438/93 |
| 2005/0077512 A1 | 4/2005 | Yoon et al. | |
| 2005/0199886 A1 | 9/2005 | Yi et al. | |
| 2006/0091408 A1 | 5/2006 | Kim et al. | |
| 2006/0270201 A1* | 11/2006 | Chua et al. | 438/481 |
| 2009/0079035 A1* | 3/2009 | Wang | 257/615 |
| 2009/0098714 A1 | 4/2009 | Chang et al. | |
| 2010/0133658 A1 | 6/2010 | Dadgar et al. | |
| 2010/0252805 A1* | 10/2010 | Chu et al. | 257/11 |

FOREIGN PATENT DOCUMENTS

| | | |
|---|---|---|
| JP | 2009-99932 A | 5/2009 |
| JP | 2009-130010 A | 6/2009 |
| KR | 10-0646696 B1 | 11/2006 |
| KR | 10-0664986 B1 | 12/2006 |
| KR | 10-0744933 B1 | 7/2007 |
| KR | 10-2008-0081513 A | 9/2008 |
| KR | 10-0936869 B1 | 1/2010 |
| KR | 10-2010-0017413 A | 2/2010 |

OTHER PUBLICATIONS

Dadgar, A., Alam, A., Riemann, T., Biäsing, J., Diez, A., Poschenrieder, M., Strassburg, M., Heuken, M., Christen, J. and Krost, A. (2001), Crack-Free InGaN/GaN Light Emitters on Si(111). phys. stat. sol. (a), 188: 155-158.*

Wang, Yongjin, Fangren Hu, Yoshiaki Kanamori, Tong Wu, and Kazuhiro Hane. "Large Area, Freestanding GaN Nanocolumn Membrane with Bottom Subwavelength Nanostructure." Optics Express 18.6 (2010): 5504.*

D. M. Deng, N. S. Yu, Y. Wang, X. B. Zou, H. C. Kuo, P. Chen, and K. M. Lau, Appl. Phys. Lett. 96, 201106 (2010).*

(Continued)

*Primary Examiner* — Thomas L Dickey
*Assistant Examiner* — Joseph Schoenholtz
(74) *Attorney, Agent, or Firm* — Sughrue Mion, PLLC

(57) ABSTRACT

A semiconductor device, a method of manufacturing the semiconductor device, and an electronic device including the semiconductor device are provided. The semiconductor device includes a silicon substrate; a plurality of nanorods formed on the silicon substrate; and a nitride semiconductor layer formed on the silicon substrate and the plurality of nanorods, wherein a plurality of voids are formed between the silicon substrate and the nitride semiconductor in regions between the plurality of nanorods.

20 Claims, 3 Drawing Sheets

OTHER PUBLICATIONS

Zubia, D., and S. D. Hersee. "Nanoheteroepitaxy: The Application of Nanostructuring and Substrate Compliance to the Heteroepitaxy of Mismatched Semiconductor Materials." Journal of Applied Physics 85.9 (1999): 6492.*

Rauls, E., S. J. Dijkstra, and W. G. Schmidt. "Atomic Structure and Energetics of the C -GaN(001) Surface." Physical Review B 78.11 (2008).*

Hsieh, Min-Yann, Cheng-Yin Wang, Liang-Yi Chen, Min-Yung Ke, and JianJang Huang. "InGaN-GaN Nanorod Light Emitting Arrays Fabricated by Silica Nanomasks." IEEE Journal of Quantum Electronics 44.5 (2008): 468-72.*

Kuo, Cheng-Tai, Kai-Kuen Chang, Hung-Wei Shiu, Chia-Rong Liu, Lo-Yueh Chang, Chia-Hao Chen, and Shangjr Gwo. "Natural Band Alignments of InN/GaN/AlN Nanorod Heterojunctions." Applied Physics Letters 99.12 (2011): 122101.*

Chiu, C. H., H. H. Yen, C. L. Chao, Z. Y. Li, Peichen Yu, H. C. Kuo, T. C. Lu, S. C. Wang, K. M. Lau, and S. J. Cheng. "Nanoscale Epitaxial Lateral Overgrowth of GaN-based Light-emitting Diodes on a SiO[sub 2] Nanorod-array Patterned Sapphire Template." Applied Physics Letters 93.8 (2008): 081108.*

Ling, Shih-Chun, Chu-Li Chao, Jun-Rong Chen, Po-Chun Liu, Tsung-Shine Ko, Tien-Chang Lu, Hao-Chung Kuo, Shing-Chung Wang, Shun-Jen Cheng, and Jenq-Dar Tsay. "Nanorod Epitaxial Lateral Overgrowth of A-plane GaN with Low Dislocation Density." Applied Physics Letters 94.25 (2009): 251912.*

Kryliouk, Olga, Hyun Jong Park, Yong Sun Won, Tim Anderson, Albert Davydov, Igor Levin, Ji Hyun Kim, and Jaime A. Freitas. "Controlled Synthesis of Single-crystalline InN Nanorods." Nanotechnology 18.13 (2007): 135606.*

Ishikawa, H. et., al. "Thermal stability of GaN on (1 1 1) Si substrate", Journal of Crystal Growth., 189/190, 1998, pp. 178-182.

He, H. Jr. et., al. "Aligned AlN Nanorods with Multi-tipped Surfaces—Growth, Field—Emission, and Cathodoluminescence Properties", Advanced Materials, 2006, 18, pp. 650-654.

Raghavan, S. et., al. "Growth stresses and cracking in GaN films on (111) Si grown by metalorganic chemical vapor deposition. II. Graded AlGaN buffer layers", Journal of Applied Physics, 2005, 98. Downloaded Apr. 11, 2011 from http://jap.aip.org/about/rights_and_permissions.

Lei, B. et., al. "High-Quality GaN Film Grown by Hvpe with an Anodized Aluminum Oxide Mask", Electrochemical and Solid—State Letters, 9 (7), 2006, pp. G242-G244.

Karpov, S.Y. et., al. "Dislocation Effect on Light Emission Efficiency in Gallium Nitride" Appl. Phys. Lett. 81, No. 23, 2002, pp. 1-5.

* cited by examiner

SEMICONDUCTOR DEVICE, METHOD OF MANUFACTURING THE SAME, AND ELECTRONIC DEVICE INCLUDING THE SEMICONDUCTOR DEVICE

CROSS-REFERENCE TO RELATED APPLICATION

This application claims priority from Korean Patent Application No. 10-2010-0130177, filed Dec. 17, 2010 in the Korean Intellectual Property Office, the entire contents of which are herein incorporated by reference.

BACKGROUND

1. Field

The present disclosure relates to a semiconductor device, a method of manufacturing the same, and an electronic device including the semiconductor device.

2. Description of the Related Art

A light emitting diode is a diode that emits light due to a current flowing therethrough, and light emitting diodes are used in various electronic devices. In the light emitting diode, electrons and holes are transmitted and bonded through a PN junction when applying a forward voltage to a semiconductor material, and a generated energy difference is emitted in a form of light and heat.

An electronic device such as a light emitting diode may include a semiconductor device in which a nitride semiconductor is formed on a substrate. The substrate may include, for example, a sapphire ($Al_2O_3$) substrate or a silicon carbide (SiC) substrate, but with these substrates it is difficult to provide a large area light emitting element. Additionally, these substrates are expensive to produce and have poor electrical conductivity and poor light efficiency.

A silicon substrate may be used instead of the above-noted substrates. However, the silicon substrate may chemically react upon contacting a nitride semiconductor and cracks may form in the contacting region due to differences in the coefficient of thermal expansion between the silicon and the nitride semiconductor.

SUMMARY

One or more embodiments provide a semiconductor device that have chemical stability and reduce crack generation.

One or more embodiments also provide a method of manufacturing the semiconductor device.

One or more embodiments also provide an electronic device including the semiconductor device.

According an aspect of an embodiment, there is provided a semiconductor device including a silicon substrate; a plurality of nanorods formed on the silicon substrate; and a nitride semiconductor layer formed on the silicon substrate and the plurality of nanorods, wherein a plurality of voids are formed between the silicon substrate and the nitride semiconductor in regions between the plurality of nanorods.

The nitride semiconductor layer may include gallium nitride (GaN), aluminum nitride (AlN), indium nitride (InN), or any combination thereof.

The nitride semiconductor layer may have a thickness of about 100 nm to about 500 μm.

The nanorods and the nitride semiconductor layer may have a same crystal structure.

The crystal structure may be a face-centered cubic (FCC) crystal structure or a hexagonal close-packed (HCP) crystal structure.

The nanorods may have a diameter of about 5 nm to about 100 μm and a length of about 5 nm to about 100 μm.

The nanorods may include a metal nitride, a metal oxide, a semiconductor nitride, a semiconductor oxide, a Group III-V compound, a Group II-VI compound, or any combination thereof.

The nanorods may include aluminum nitride (AlN), titanium nitride (TiN), zinc oxide (ZnO), or any combination thereof.

The voids may have a diameter of about 5 nm to about 100 μm.

According to an aspect of another exemplary embodiment, there is provided a method of manufacturing a semiconductor device, the method including providing a plurality of nanorods on a silicon substrate; and providing a nitride semiconductor layer on the silicon substrate and the nanorods at a temperature at which the silicon substrate is melt-back etched to form a plurality of voids between the silicon substrate and the nitride semiconductor layer at a regions between the plurality of nanorods.

The silicon substrate may be meltback-etched at a temperature ranging from about 800° C. to about 1100° C.

The nanorods or the nitride semiconductor layer, or both, may be performed by metal organic chemical vapor deposition (MOCVD) or hybrid vapor phase epitaxy (HVPE), or a combination thereof.

The nanorods may be provided at about 500° C. to about 1050° C.

The nanorods and the nitride semiconductor layer may have a same crystal structure.

The nitride semiconductor layer may include gallium nitride (GaN), aluminum nitride (AlN), indium nitride (InN), or a combination thereof, and the nanorods may include a metal nitride, a metal oxide, a semiconductor nitride, a semiconductor oxide, a Group III-V compound, a Group II-VI compound, or any combination thereof.

The nitride semiconductor layer may have a thickness of about 100 nm to about 500 μm.

The nanorods may have a diameter of about 5 nm to about 100 μm and a length of about 5 nm to about 100 μm.

According to an aspect of another exemplary embodiment, there is provided an electronic device including a semiconductor device comprising a silicon substrate; a plurality of nanorods formed on the silicon substrate; and a nitride semiconductor layer formed on the silicon substrate and the plurality of nanorods, wherein a plurality of voids are formed between the silicon substrate and the nitride semiconductor in regions between the plurality of nanorods.

BRIEF DESCRIPTION OF THE DRAWINGS

The above and/or other aspects will become apparent and more readily appreciated from the following description of the embodiments, taken in conjunction with the accompanying drawings, in which.

DETAILED DESCRIPTION

Figure 1:
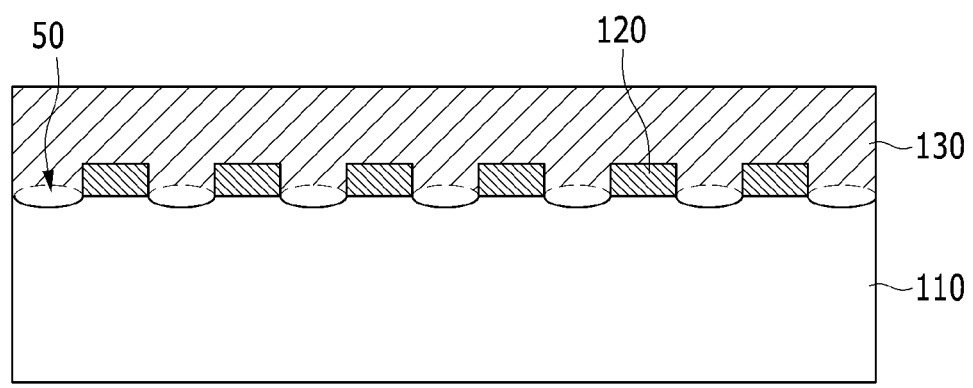
FIG. 1 is a cross-sectional view schematically showing a semiconductor device according to an embodiment.

Exemplary embodiments will hereinafter be described in detail, such that they may be performed by those who have common knowledge in the related art. This disclosure may, however, be embodied in many different forms and should not be construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, the layer, film, region, or substrate can be directly on the other element or intervening elements may also be present. In contrast, when an element is referred to as being "directly on" another element, there are no intervening elements present. Additionally, as used herein, "any combination thereof" includes any combination of two or more of the enumerated substances, and includes a combination of all of the enumerated substances.

The semiconductor device according to an embodiment is described with reference to FIG. 1.

FIG. 1 is a schematic cross-sectional view showing a semiconductor device according to an embodiment.

Referring to FIG. 1, the semiconductor device includes a silicon substrate 110, a plurality of nanorods 120 formed on the silicon substrate 110, and a nitride semiconductor layer 130 formed on the silicon substrate 110 and the nanorods 120.

The silicon substrate 110 may be a mono-crystalline silicon substrate.

The nanorods 120 may be formed in plural and separated from each other on the silicon substrate 110. The nanorods 120 may be aligned in parallel in a row or column direction or randomly aligned. Adjacent nanorods 120 may be spaced apart by several nanometers to several hundred micrometers, for example, by about 5 nm to about 100 μm.

The nanorods 120 may include a metal nitride, a metal oxide, a semiconductor nitride, a semiconductor oxide, a Group III-V compound, a Group II-VI compound, or any combination thereof. The nanorods 120 may be formed of, for example, aluminum nitride (AlN), titanium nitride (TiN), zinc oxide (ZnO), or a combination thereof.

Each of the nanorods 120 may be formed to have a size of several nanometers to several hundred micrometers, and for example, each nanorod 120 may have a diameter of about 5 nm to about 100 μm and a length of about 5 nm to about 100 μm.

The nitride semiconductor layer 130 may be provided on the silicon substrate 110 and the nanorods 120.

The nitride semiconductor layer 130 includes regions between adjacent nanorods 120 and regions that cover the upper part of nanorods 120.

The nitride semiconductor layer 130 may be formed of a nitride semiconductor, for example gallium nitride (GaN), aluminum nitride (AlN), indium nitride (InN), or a combination thereof.

The nitride semiconductor layer 130 may have a thickness of about 100 nm to about 500 μm.

The nitride semiconductor layer 130 may have a same crystal structure as the nanorods 120. For example, the nanorods 120 and the nitride semiconductor layer 130 may have the same crystal structure of a face-centered cubic (FCC) crystal structure or a hexagonal close-packed (HCP) crystal structure. Such a crystal structure facilitates epitaxial growth.

On the other hand, the silicon substrate 110 has a plurality of voids 50 formed at regions contacting the nitride semiconductor layer 130.

Silicon (Si) of the silicone substrate 110 and the nitride semiconductor of the nitride semiconductor layer 130 chemically react in the regions where the silicon substrate 110 and the nitride semiconductor layer 130 contact, so as to diffuse silicon into the nitride semiconductor which is melt-back etching of the silicon substrate 110. Accordingly, a part of the silicon substrate 110 surface is removed to provide the voids.

The melt-back etching of the silicon substrate 110 only occurs at the regions where the silicon substrate 110 directly contacts to the nitride semiconductor layer 130, so melt-back etching is not provided on the regions where the nanorods 120 are formed.

Accordingly, as shown in FIG. 1, the voids 50 are formed at the regions of the silicon substrate 110 surface where the nanorods 120 are not formed.

In other words, the voids 50 may be formed between the adjacent nanorods 120, and the voids 50 may have a size of several nanometers to several hundred nanometers to match a size of the gap between the adjacent nanorods 120. For example, the voids 50 may be provided in a diameter of about 5 nm to about 100 μm.

The voids 50 may decrease stress caused by a thermal expansion coefficient difference between the silicon substrate 110 and the nitride semiconductor layer 130 since the voids 50 are locally provided on the surface of the silicon substrate 110. Accordingly, crack generation on the silicon substrate 110 surface may be reduced and defects due to cracks may be decreased.

Accordingly the semiconductor device provides a high quality nitride semiconductor layer 130 on the silicon substrate 110 and also reduces light absorption and total reflection of the silicon substrate 110 due to the nanorods 120 and voids 50, so as to reduce the loss of light emitted from the nitride semiconductor layer 130 and to improve the luminous efficiency.

In addition, the semiconductor device saves costs since the semiconductor device including a nitride semiconductor is manufactured by using a relatively inexpensive silicon substrate, and the above described inventive concept may be easily applied to a wide area semiconductor device.

Hereinafter, a method of manufacturing a semiconductor device is described with reference to FIG. 2 and FIG. 3 together with FIG. 1.

Figure 2:
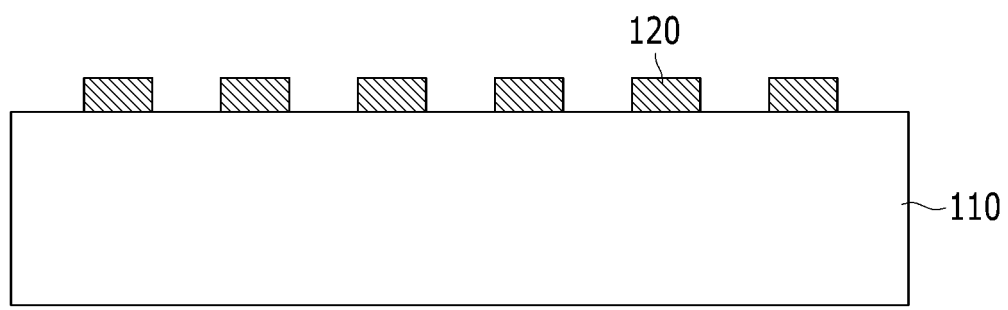
FIG. 2 and FIG. 3 are cross-sectional views sequentially showing a method of manufacturing the semiconductor device of FIG. 1.
Figure 3:
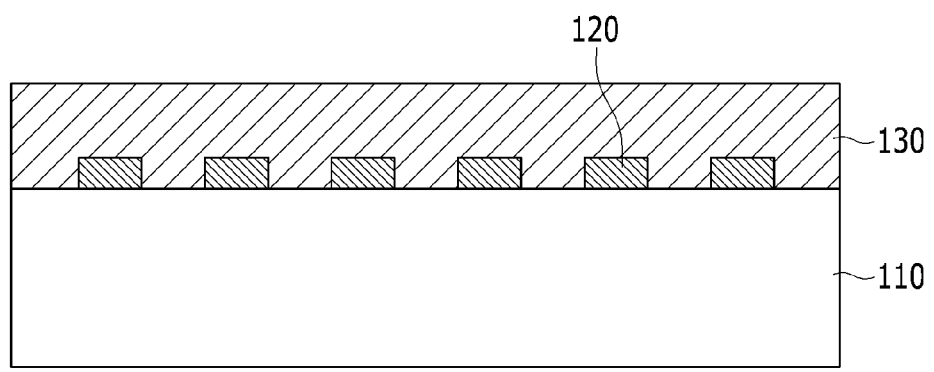

FIG. 2 and FIG. 3 are cross-sectional views sequentially showing the method of manufacturing a semiconductor device shown in FIG. 1.

First, referring to FIG. 2, a plurality of nanorods 120 are formed on the silicon substrate 110.

The nanorods 120 may be formed of a metal nitride, a metal oxide, a semiconductor nitride, a semiconductor oxide, a Group III-V compound, a Group II-VI compound, or a combination thereof, for example aluminum nitride (AlN), titanium nitride (TiN), zinc oxide (ZnO), or a combination thereof.

The nanorods 120 may be formed by a method of metal organic chemical vapor deposition (MOCVD), hybrid vapor phase epitaxy (HVPE), or a combination thereof.

For example, when nanorods 120 made of aluminum nitride (AlN) are fabricated according to metal organic chemical vapor deposition (MOCVD), trimethyl aluminum may be used as an aluminum source and nitrogen gas may be used as a nitrogen source. The deposition time may be adjusted to provide the nanorods 120 with appropriate diameter and length. For example, the nanorods 120 may have a diameter of about 5 nm to 100 μm and a length of about 5 nm to 100 μm.

The nanorods 120 may be formed at, for example, about 500° C. to about 1050° C.

Referring to FIG. 3, a nitride semiconductor layer 130 is formed on the silicon substrate 110 and the nanorods 120.

The nitride semiconductor layer 130 may be formed of a nitride semiconductor, for example gallium nitride (GaN), aluminum nitride (AlN), indium nitride (InN), or a combination thereof, and may have a thickness of about 100 nm to about 500 μm.

The nitride semiconductor layer 130 may have a same crystal structure as the nanorods 120. For example, the nitride semiconductor layer 130 may have a face-centered cubic (FCC) crystal structure or a hexagonal close-packed (HCP) crystal structure.

The nitride semiconductor layer 130 may be formed by a method of, for example, MOCVD, HVPE, or a combination thereof.

The nitride semiconductor layer 130 may be prepared at a temperature at which the silicon substrate 110 is melt-back etched. The temperature of meltback-etching the silicon substrate 110 may range, for example, from about 800° C. to about 1100° C.

The nitride semiconductor layer 130 is formed at a temperature at which the silicon substrate 110 is melt-back etched, so a plurality of voids 50 may be formed at regions where the nitride semiconductor layer 130 contacts the silicon substrate 110 surface, which are the regions between the nanorods 120.

The voids 50 may be obtained by chemically reacting silicon (Si) with the nitride semiconductor at the regions between the nanorods 120 where the silicon substrate 110 and the nitride semiconductor layer 130 contact to each other to diffuse silicon into the nitride semiconductor, so as to eliminate a part of the silicon substrate 110 surface.

The semiconductor device including the nitride semiconductor layer may be applied to various electronic devices. For example, the semiconductor device may be applied to a light emitting device such as a light emitting diode, a backlight unit, and the like.

While this disclosure has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A semiconductor device comprising:
    a silicon substrate;
    a plurality of nanorods formed on the silicon substrate; and
    a nitride semiconductor layer formed on the silicon substrate and the plurality of nanorods,
    wherein a plurality of voids are formed in the silicon substrate between the silicon substrate and the nitride semiconductor in regions between the plurality of nanorods.

2. The semiconductor device of claim 1, wherein the nitride semiconductor layer comprises gallium nitride (GaN), aluminum nitride (AlN), indium nitride (InN), or any combination thereof.

3. The semiconductor device of claim 1, wherein the nitride semiconductor layer has a thickness of about 100 nm to about 500 μm.

4. The semiconductor device of claim 1, wherein the nanorods and the nitride semiconductor layer have a same crystal structure.

5. The semiconductor device of claim 4, wherein the crystal structure is a face-centered cubic (FCC) crystal structure or a hexagonal close-packed (HCP) crystal structure.

6. The semiconductor device of claim 1, wherein the nanorods have a diameter of about 5 nm to about 100 μm and a length of about 5 nm to about 100 μm.

7. The semiconductor device of claim 1, wherein the nanorods comprise a metal nitride, a metal oxide, a semiconductor nitride, a semiconductor oxide, a Group III-V compound, a Group II-VI compound, or any combination thereof.

8. The semiconductor device of claim 7, wherein the nanorods comprise aluminum nitride (AlN), titanium nitride (TiN), zinc oxide (ZnO), or any combination thereof.

9. The semiconductor device of claim 1, wherein the voids have a diameter of about 5 nm to about 100 μm.

10. A method of manufacturing a semiconductor device, the method comprising:
    providing a plurality of nanorods on a silicon substrate; and
    providing a nitride semiconductor layer on the silicon substrate and the nanorods at a temperature at which the silicon substrate is melt-back etched to form a plurality of voids in the silicon substrate between the silicon substrate and the nitride semiconductor layer at regions between the plurality of nanorods.

11. The method of claim 10, wherein the temperature at which the silicon substrate is melt-back etched ranges from about 800° C. to about 1100° C.

12. The method of claim 10, wherein the plurality of nanorods or the nitride semiconductor layer, or both, is provided by metal organic chemical vapor deposition (MOCVD), hybrid vapor phase epitaxy (HVPE), or a combination thereof.

13. The method of claim 10, wherein the nanorods are provided at about 500° C. to about 1050° C.

14. The method of claim 10, wherein the nanorods and the nitride semiconductor layer have a same crystal structure.

15. The method of claim 10, wherein the nitride semiconductor layer comprises gallium nitride (GaN), aluminum nitride (AlN), indium nitride (InN), or any combination thereof, and
    the nanorods comprise a metal nitride, a metal oxide, a semiconductor nitride, a semiconductor oxide, a Group III-V compound, a Group II-VI compound, or any combination thereof.

16. The method of claim 10, wherein the nitride semiconductor layer has a thickness of about 100 nm to about 500 μm.

17. The method of claim 10, wherein the nanorods have a diameter of about 5 nm to about 100 μm and a length of about 5 nm to about 100 μm.

18. An electronic device comprising a semiconductor device comprising:
    a silicon substrate;
    a plurality of nanorods formed on the silicon substrate; and
    a nitride semiconductor layer formed on the silicon substrate and the plurality of nanorods,
    wherein a plurality of voids are formed in the silicon substrate between the silicon substrate and the nitride semiconductor in regions between the plurality of nanorods.

19. The electronic device of claim 18, wherein:
    the nanorods have a diameter of about 5 nm to about 100 μm and a length of about 5 nm to about 100 μm, and
    the voids have a diameter of about 5 nm to about 100 μm.

20. The electronic device of claim 19, wherein:
    the nitride semiconductor layer comprises gallium nitride (GaN), aluminum nitride (AlN), indium nitride (InN), or any combination thereof,
    the nanorods and the nitride semiconductor layer have a same crystal structure, and
    the nanorods comprise a metal nitride, a metal oxide, a semiconductor nitride, a semiconductor oxide, a Group III-V compound, a Group II-VI compound, or any combination thereof.

* * * * *